US009026964B2

(12) United States Patent
Mohanty et al.

(10) Patent No.: US 9,026,964 B2
(45) Date of Patent: May 5, 2015

(54) INTELLIGENT METAMODEL INTEGRATED VERILOG-AMS FOR FAST AND ACCURATE ANALOG BLOCK DESIGN EXPLORATION

(71) Applicant: University of North Texas, Denton, TX (US)

(72) Inventors: Saraju P. Mohanty, Denton, TX (US); Elias Kougianos, Denton, TX (US); Geng Zheng, Denton, TX (US)

(73) Assignee: University of North Texas, Denton, TX (US)

( * ) Notice: Subject to any disclaimer, the term of this patent is extended or adjusted under 35 U.S.C. 154(b) by 0 days.

(21) Appl. No.: 14/206,385

(22) Filed: Mar. 12, 2014

(65) Prior Publication Data

US 2014/0282314 A1  Sep. 18, 2014

Related U.S. Application Data

(60) Provisional application No. 61/779,009, filed on Mar. 13, 2013.

(51) Int. Cl.
*G06F 17/50* (2006.01)
*G06F 9/455* (2006.01)

(52) U.S. Cl.
CPC .................................. *G06F 17/5045* (2013.01)

(58) Field of Classification Search
USPC .......... 716/104, 106, 107, 108, 132, 133, 134
See application file for complete search history.

(56) References Cited

U.S. PATENT DOCUMENTS

| 7,409,331 | B2 * | 8/2008 | Gupta ............................. 703/28 |
| 7,516,423 | B2 | 4/2009 | De Smedt et al. |
| 7,823,116 | B2 | 10/2010 | Chan |
| 8,117,576 | B2 * | 2/2012 | Mossawir et al. ............. 716/107 |
| 8,423,934 | B1 * | 4/2013 | Foster et al. .................. 716/107 |
| 2002/0072003 | A1 * | 6/2002 | Brill et al. ...................... 430/30 |
| 2003/0126570 | A1 * | 7/2003 | Du et al. ........................... 716/8 |
| 2005/0257178 | A1 | 11/2005 | Daems et al. |
| 2009/0228849 | A1 * | 9/2009 | Mossawir et al. ................ 716/5 |
| 2010/0083200 | A1 * | 4/2010 | Song et al. ........................ 716/5 |

OTHER PUBLICATIONS

De Jonghe, et al; Efficient Analytical Macromodeling of Large Analog Circuits by Transfer Function Trajectories; Proc. IEEE/ACM Int Computer-Aided Design (ICCAD) Conf., 2011, pp. 91-94.
Gomez, G. J., et al; A Nonlinear Macromodel for CMOS Otas; Proc. IEEE Int. Symp. Circuits and Systems,1995, pp. 920-923.
Liu, H., et al; Remembrance of Circuits Past: Macromodeling by Data Mining in Large Analog Design Spaces; Proc. 39th Design Automation Conf., 2002, pp. 437-442.

(Continued)

*Primary Examiner* — Brian Ngo
(74) *Attorney, Agent, or Firm* — Jackson Walker L.L.P.

(57) ABSTRACT

A method for modeling a circuit comprising storing a plurality of design variable ranges for a circuit component in a non-transient electronic data memory. Performing transistor-level simulations at a plurality of sample points for the circuit component to generate a plurality of design variable samples for the circuit component. Storing a neural network architecture in the non-transient electronic data memory that models the plurality of design variable samples for the circuit component. Storing a performance metric metamodel and a circuit parameter metamodel generated using Verilog-AMS.

15 Claims, 10 Drawing Sheets

(56) References Cited

OTHER PUBLICATIONS

Romijn, R., et al; A Grey-Box Modeling Approach for the Reduction of Nonlinear Systems; Journal of Process Control, vol. 18, No. 9, pp. 906-914, 2008.

Wang, J., et al; Parameterized Macromodeling for Analog System-Level Design Exploration; Proc. 44th ACM-IEEE Design Automation Conf., 2007, pp. 940-943.

Wolfe, G., et al; Extraction and Use of Neural Network Models in Automated Synthesis of Operational Amplifiers; IEEE Trans. Computer-Aided Design Integrated Circuits Syst., vol. 22, No. 2, pp. 198-212, 2003.

Zhang, H., et al; Symbolic Behavioral Modeling for Slew and Settling Analysis of Operational Amplifiers; Proc. IEEE 54th Midwest Int Symp on Circuits and Systems (MWSCAS), 2011, pp. 1-4.

\* cited by examiner

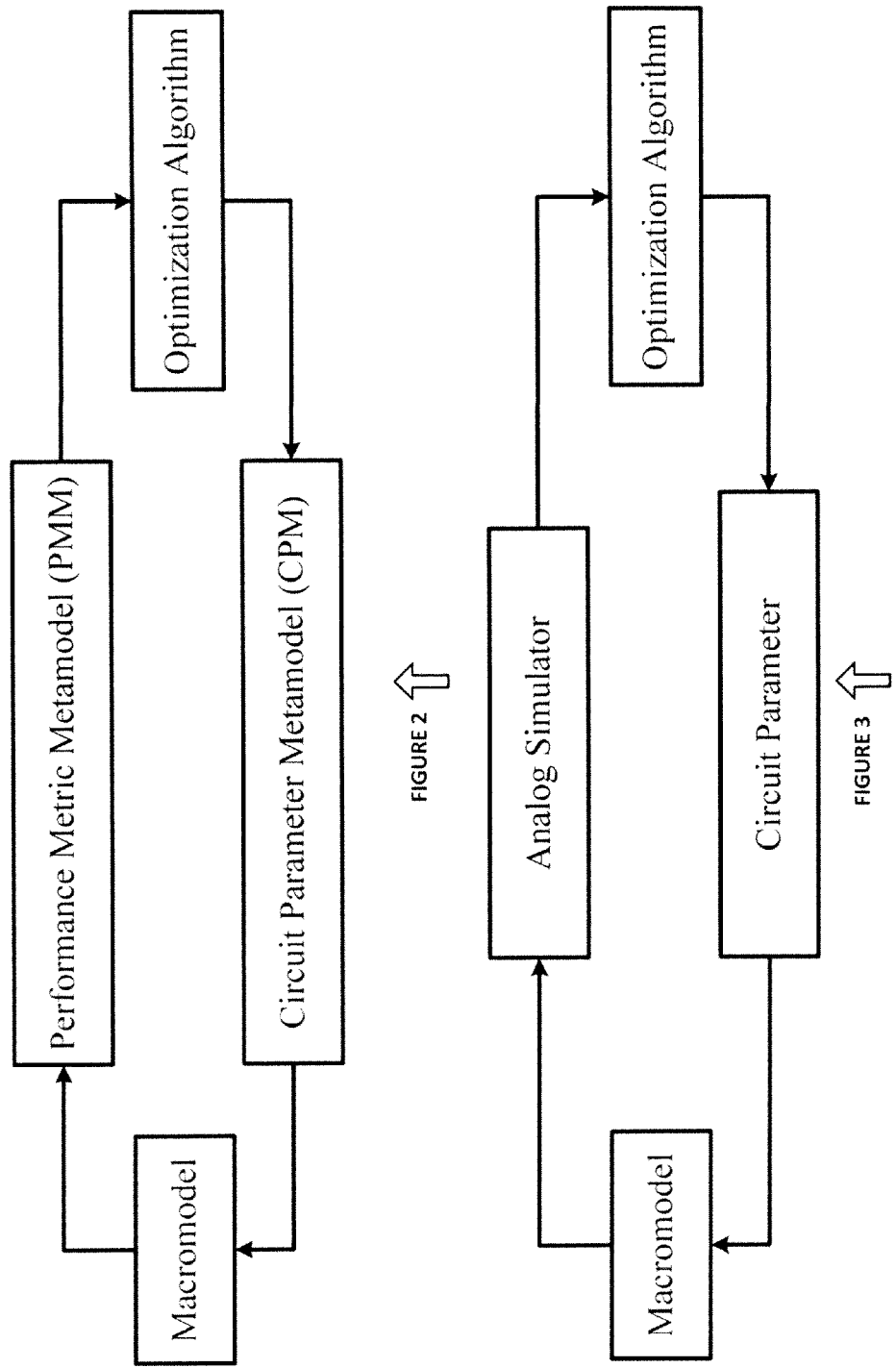

US 9,026,964 B2

INTELLIGENT METAMODEL INTEGRATED VERILOG-AMS FOR FAST AND ACCURATE ANALOG BLOCK DESIGN EXPLORATION

This application claims the benefit of U.S. Provisional Patent Application Ser. No. 61/779,009, entitled AN INTELLIGENT METAMODEL INTEGRATED VERILOG-AMS FOR FAST AND ACCURATE ANALOG BLOCK DESIGN EXPLORATION, filed on Mar. 13, 2013, the entire content of which is hereby incorporated by reference.

TECHNICAL FIELD

The present disclosure is generally related to circuit modelling, and more specifically related to an intelligent surrogate model for low-level analog circuit building blocks that bridges behavioral and transistor-level (or layout-level) simulations.

BACKGROUND OF THE INVENTION

The gap between abstraction levels in analog design is a major obstacle for advancing, implementing and verifying analog and mixed-signal integrated circuit design. In order to achieve high performance and high yield, mixed-signal system components or analog blocks must be optimized at both system and circuit levels. For a top-down design approach, this process starts with designing and optimizing the system with block or component models at high levels of abstraction. The specifications for each block that lead to the best system performance are then obtained. Each sub-block is then designed and optimized toward these specifications. The issue with this approach is that generating an accurate model, if it is even feasible, takes significant effort. Therefore, some important characteristics of the blocks are ignored at the high-level simulations, which makes the obtained sub-block specifications less reliable and less accurate.

SUMMARY OF THE INVENTION

A method for modeling a circuit is provided that includes storing a plurality of design variable ranges for a circuit component in a non-transient electronic data memory. Transistor-level simulations are then performed at a plurality of sample points for the circuit component to generate a plurality of design variable samples for the circuit component. A neural network architecture is stored in the non-transient electronic data memory that models the plurality of design variable samples for the circuit component. A performance metric metamodel and a circuit parameter metamodel are stored that are generated using Verilog-AMS.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which:

FIG. 2 is a diagram of a mixed-signal component and analog block optimization flow at the circuit or layout level using the iVAMS framework;

FIG. 3 is a diagram of a design flow is presented that does not use metamodels;

DETAILED DESCRIPTION OF THE INVENTION

Figure 1:
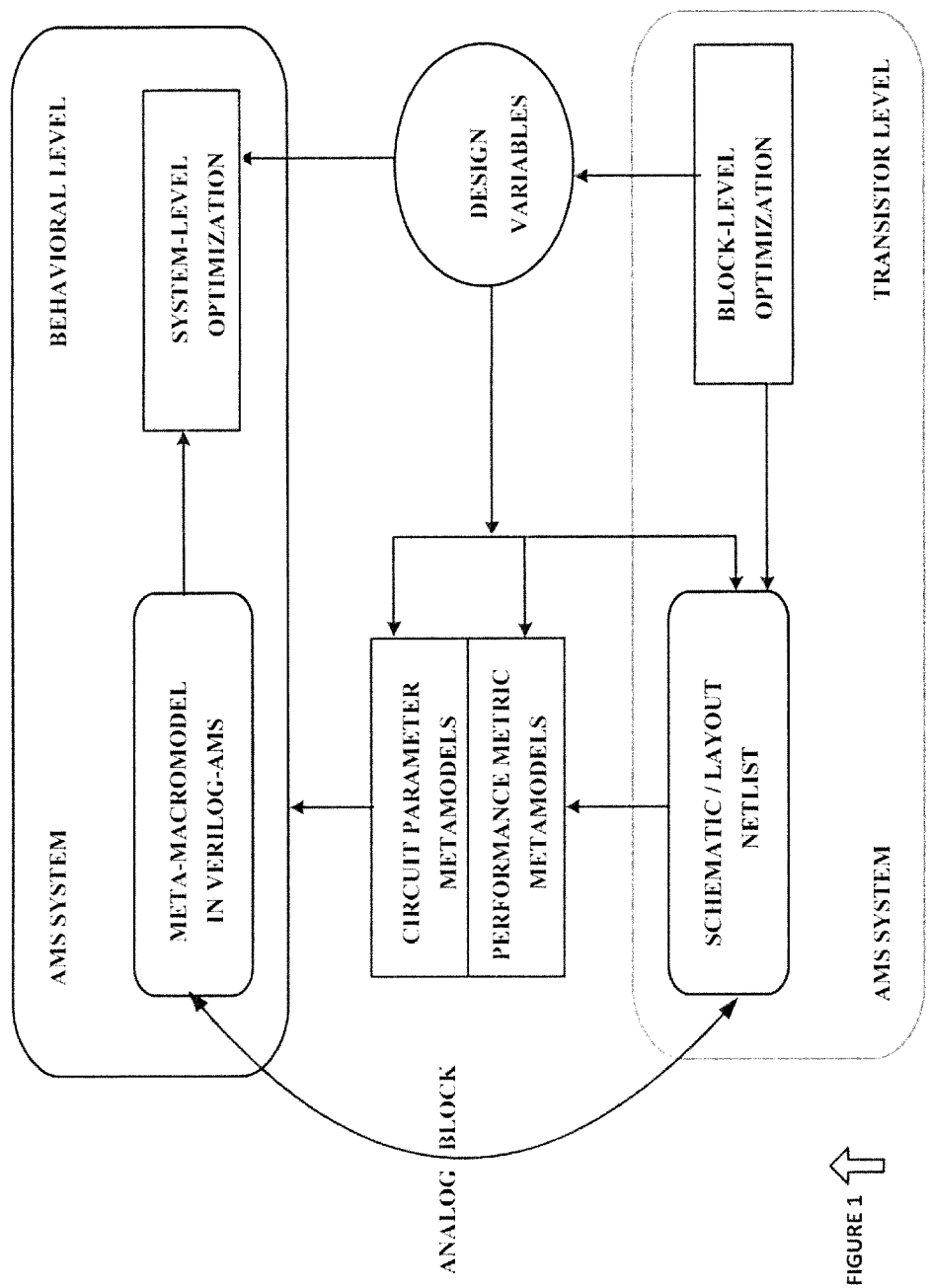
FIG. 1 is a diagram of circuit or layout level information built-in to iVAMS by using a set of intelligent artificial neural network metamodels, in accordance with an exemplary embodiment of the present disclosure.

In the description that follows, like parts are marked throughout the specification and drawings with the same reference numerals. The drawing figures might not be to scale and certain components can be shown in generalized or schematic form and identified by commercial designations in the interest of clarity and conciseness.

The present disclosure provides a surrogate model for low-level analog building block to bridge behavioral and transistor-level (or layout-level) simulations. The model can accurately estimate the characteristics of the analog block in a large design space. Artificial neural network metamodels are adopted to capture the highly nonlinear nature of the analog blocks or mixed-signal components. These intelligent models can be applied to multi-objective analog block optimization. Parameterized behavioral models in a commonly used hardware description language, Verilog-AMS, based on artificial neural network (ANN) metamodels can also be constructed for efficient system-level design exploration. The integration of ANN into Verilog-AMS of the present disclosure can also be called Intelligent Verilog-AMS (iVAMS). Two different algorithms, firefly optimization algorithm (FOA), and cuckoo search algorithm (CSA), can be used for optimization within the iVAMS framework. The speed of analog design optimization can be increased by up to 5000 times, compared to transistor-level simulation, due to the use of iVAMS, with negligible loss in accuracy.

The present disclosure can be used to provide the following novel functionality and features:
1) An intelligent-metamodel integrated Verilog-AMS (iVAMS).
2) A Verilog-A model for the new 4th fundamental electronic element called memristor.
3) Meta-macromodels for analog blocks.
4) Two different forms of metamodels: performance metric metamodel (PMM) and circuit parameter metamodel (CPM).
5) Intelligent metamodel generation with artificial neural networks (ANN).
6) Construction of a neural network integrated parameterized op-amp behavioral model in Verilog-AMS.
7) A memristor-based programmable oscillator.
8) A polynomial-metamodel integrated Verilog-AMS for memristor based programmable oscillator.
9) A flow for selection of the most accurate ANN.
10) AC analysis of an analog block using iVAMS.
11) Transient analysis of an analog block using iVAMS.
12) Frequency response characterization of memristor-based programmable oscillator using iVAMS.
13) A biological-inspired firefly based algorithm for multiobjective analog block optimization using iVAMS.
14) A cuckoo search algorithm (CSA) for optimization under iVAMS.

Simulating an entire analog or mixed-signal system and performing design with transistor-level netlists, though accurate, is formidable in practice. A common solution is to simulate the analog or mixed-signal system at the behavioral level. Parameterized behavioral models can share the same design variables as the transistor-level design. When the values of the design variables change, the values of the circuit parameters for the behavioral model can also change accordingly. In this manner, the impact of the transistor-level design changes on the behavioral level can be captured.

FIG. 1 is a diagram of circuit or layout level information built-in to iVAMS by using a set of intelligent artificial neural network metamodels, in accordance with an exemplary embodiment of the present disclosure. The metamodels can be based on statistical sampling of the (very large) design space and can be presented in two different categories: (1) a performance metric metamodel (PMM); and (2) a circuit parameter metamodel (CPM). For an analog block or mixed-signal system component under consideration for design, PMMs can be used to estimate the performance, characteristics, figures of merit (FoM) for any suitable point in the multidimensional design space. No actual circuit simulation is required in this estimation process if PMMs are used instead of the circuit or layout netlists. Thus, PMMs provide an ultrafast way to explore the design space of the analog block. On the other hand, estimates of the circuit parameters are needed to construct a metamodel for the analog block. By integrating the CPMs into a macromodel and describing them in Verilog-AMS, a parameterized behavioral model, called meta-macromodel, can be obtained. A macromodel is typically a white-box or grey-box model that retains certain amount of physical information (e.g. voltages and currents) of the analog block. On the other hand, a metamodel is a black-box model that describes the analog block mathematically without explicitly carrying any physical information about the internals of the block. Constructing a macromodel for an analog block requires physical insight and can consume a great portion of the designer's time. Constructing a metamodel requires sampling the design space, which consumes CPU time. Meta-macromodeling selects a suitable macromodel and estimates the required parameters using metamodels, which is a paradigm shift of current modeling practices.

In a hierarchical approach, design information should propagate seamlessly between abstraction levels. An important part of this approach is efficient and accurate surrogate models for low-level mixed-signal or analog building blocks. When a design variable value in the building block changes, such as the size of a transistor, the model should capture the resultant changes of the building block characteristics immediately and pass them to higher levels. The model should also allow a system-level algorithm to fine tune its local design variable value to optimize the overall system performance. The following requirements can be used for such a meta-macromodel for a mixed-signal or analog design block:
(1) The model should be capable of modeling the building block performance metrics for fast design optimization.
(2) The model should be able to be used in high-level AMS behavioral simulations.
(3) The model should be parameterized so that it can capture the entire response surface of the building block with reasonable accuracy in a large design space.
(4) The construction and use of such models should only cost a small portion of an analog designer's time and the CPU time required for this process should be moderate.

FIG. 2 is a diagram of a mixed-signal component and analog block optimization flow at the circuit or layout level using the iVAMS framework. In the iVAMS framework, PMMs and circuit parameter metamodels CPMs can be used in the specified manner shown. The circuit macromodels can be modified via the CPM to obtain meta-macromodels. The PMM for different figures-of-merit (FoMs) of mixed-signal or analog blocks can be used during the design optimization phase by the optimization algorithms. The iVAMS proposed here can be built upon neural network metamodels. Such intelligent surrogate models can be used to facilitate fast block-level analog circuit optimization and accurate parameterized behavioral modeling which enables efficient system-level design exploration.

FIG. 3 is a diagram of a design flow is presented that does not use metamodels. In such a framework, macromodels or circuit/layout netlists can be used. The analog simulator can be invoked by optimization algorithms during each iteration for obtaining the FoMs at each sampled point in the design space. This flow is thousands of times slower compared to the meta-macromodel approach proposed in FIG. 2.

Figure 4:
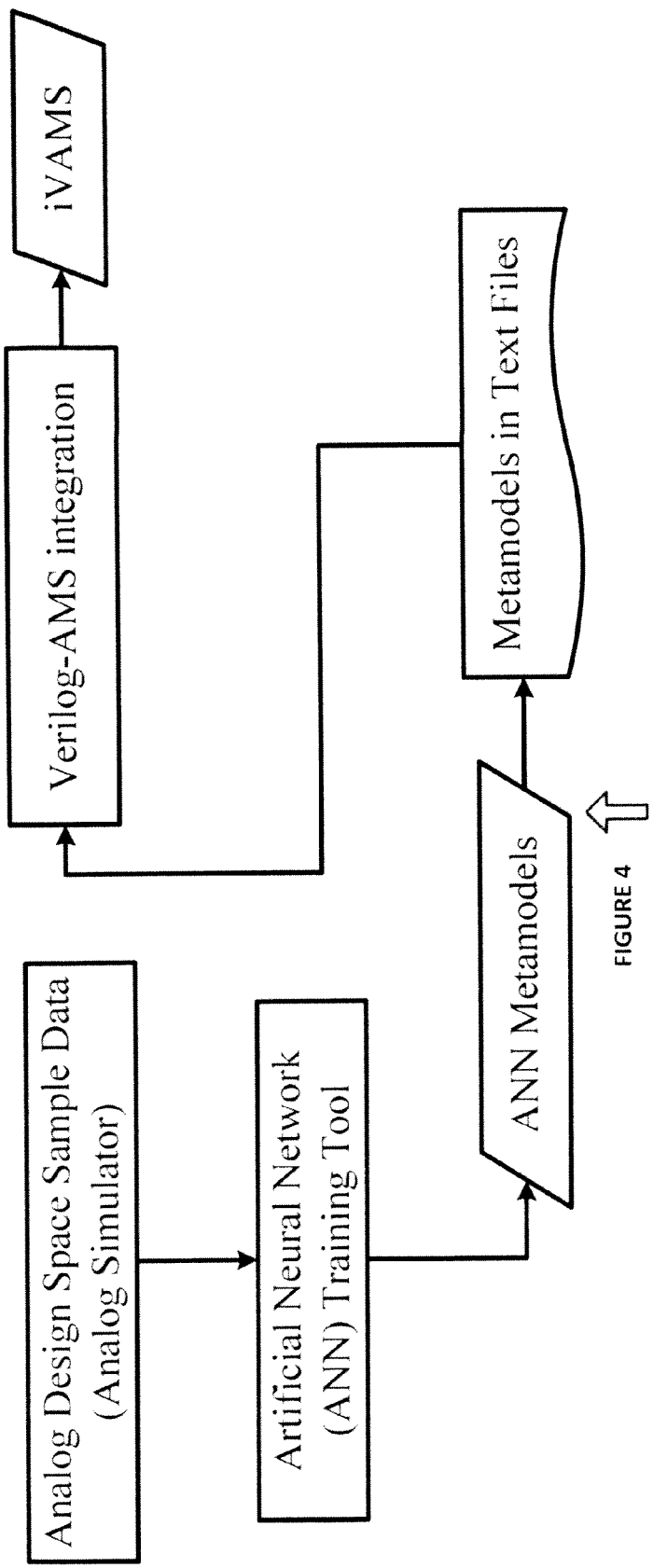
FIG. 4 is a diagram of a flow for iVAMS generation in accordance with an exemplary embodiment of the present disclosure.

Given an analog block, the goal of iVAMS generation is to obtain the artificial neural network (ANN) metamodels (both PMMs and CPMs) and the meta-macromodel integrated Verilog-AMS module. FIG. 4 is a diagram of a flow for iVAMS generation in accordance with an exemplary embodiment of the present disclosure. In this flow, an analog simulator can be used at the initial phase to obtain the circuit's FoMs at a few sample points obtained using standard statistical techniques. The responses at these points can then be fed to an ANN training tool. Subsequently, the ANN metamodels can be created for different performance metrics (PMMs) and circuit parameters (CPMs) of the mixed-signal and analog blocks. The parameters describing the ANN metamodels can be made available in plain ASCII text files, and the metamodels can then be integrated in Verilog-AMS. The resulting Verilog- AMS is now Intelligent in terms of ANN representation of circuit and layout information at the behavioral level.

Figure 5:
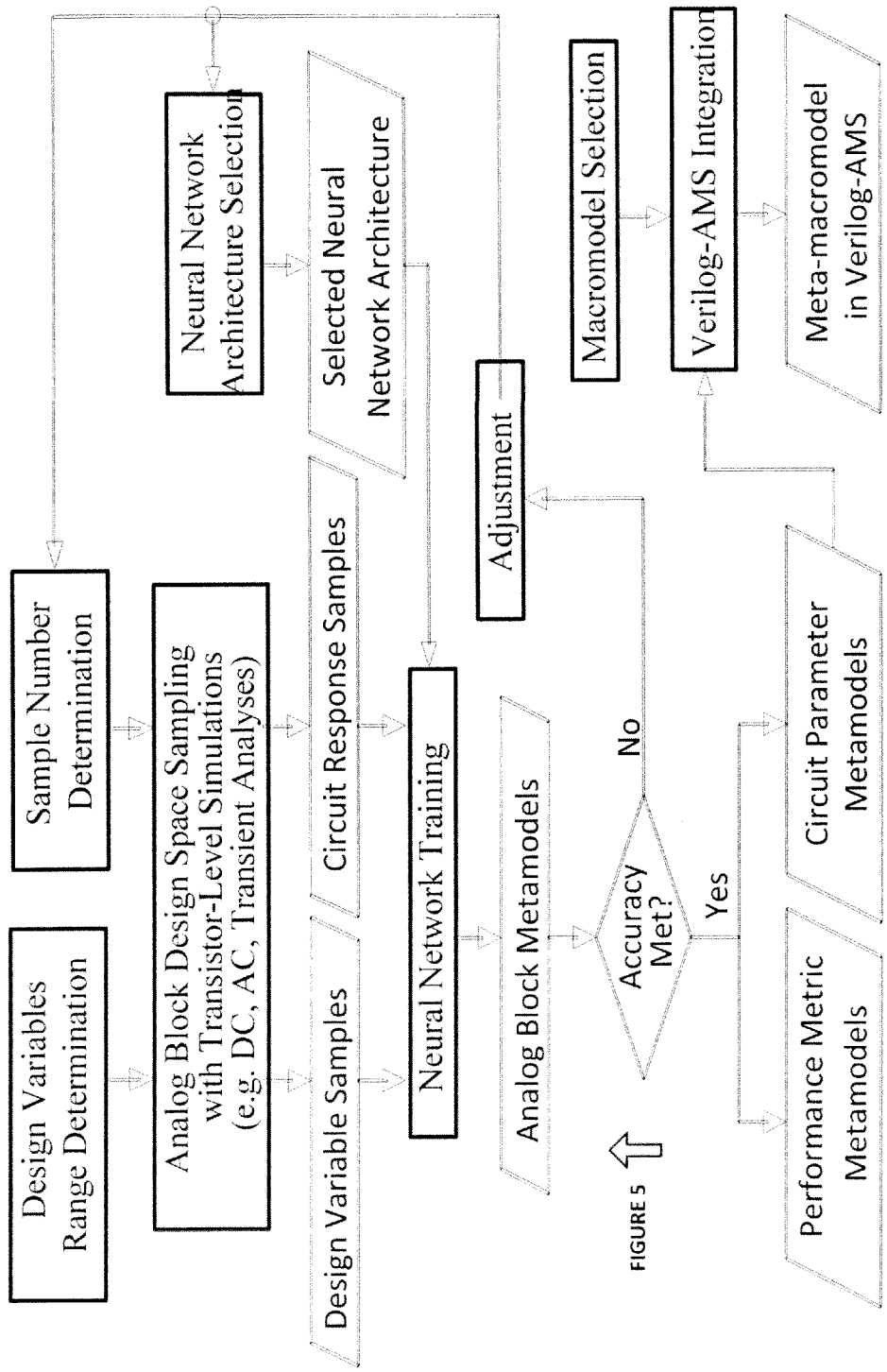
FIG. 5 is a diagram of an iVAMS generation process detailed flow, and starts with determining the design variable ranges and the number of simulation samples (available simulation budget)

FIG. 5 is a diagram of an iVAMS generation process detailed flow, and starts with determining the design variable ranges and the number of simulation samples (available simulation budget). By sampling the analog block design space and performing transistor-level simulations at these sample points, a number of design variable samples and samples of the circuit's responses of interest are obtained. Using these samples, neural networks with the selected architecture can then be trained to accurately model the circuit responses. If the accuracy is insufficient, the designer can adjust the neural network architecture and/or add more neurons in the ANN. Once the neural network metamodels with sufficient accuracy are obtained, the generated PMMs can be used in optimizing the analog block. In order to generate a meta-macromodel for the analog block in Verilog-AMS, a macromodel architecture can be selected and implemented in Verilog-AMS. The computation of the circuit parameters for the macromodel can be accomplished using CPMs and can be embedded in a special portion of the Verilog-AMS module, called an initial block.

At the transistor or device level, any suitable device and its device model can be used in the framework of iVAMS. The examples of devices include nanoscale metal-oxide field oxide transistor (Nano-MOSFET), Carbon NanoTube FET (CNT-FET), Graphene-based FET FET), Tunnel FET (T-FET), memristor or other suitable devices. A new Verilog-A based model for a thin-film memristor device is provided in source code format below:

```
'include " constants . vams"
'include " disciplines . vams"
module memristor (p1, p2 );
parameter real x0 = 0.5;         //    Initial     state
parameter real uv = 3e-18;   //  Dopant mobility
parameter real d = 40e-9;     //    Thickness
parameter real roff = 10e3;   //   OFF Resistance
parameter real ron = 1e3;     //   ON Resistance
parameter real vp =  1.7;        //    Positive    threshold
parameter real vn = -1.7;       //    Negative   threshold
real    x,    xa,    rm, dxdt ,    fz ,    fp ,    fn ,     integ ;
inout p1, p2;
electrical    p1, p2;
branch (p1,    p2) mem;
analog begin
    @( initial_step ) begin
        fz = uv * ron /    (d**2);
        fp = uv * vp /    (d**2);
        fn = uv * vn /    (d**2);
        xa = x0;
    end
    @(cross(V(mem), 0) or  cross (V(mem)-vp, 0)
    or cross (V(mem)-vn, 0));
    if    (V(mem) >= vp)
        dxdt = fp * limexp(I  (mem) * ron / vp );
    else    if  (V(mem) <= vn)
        dxdt = fn * limexp(I (mem) * ron / vn );
    else dxdt = fz * I (mem);
    if    (( integ == -1 && V(mem) > 0) || ( integ == 1 &&
V(mem) < 0)) integ = 0;
        @(cross(x,-1))    begin
            integ = -1;
            xa = 0;
        end
        @(cross(x-1,1))    begin
            integ = 1;
            xa = 1;
        end
    x = idt (dxdt , xa, integ , 1e-12);
    rm = ron * x + roff * (1 - x);
    I (mem)    <+ V(mem) / rm;
end
endmodule
```

The Verilog-A model can have different values for the memristor parameters. An exemplary set of parameters are shown in this source code list, however, the parameter values can change for different memristors. Other memristor devices such as the spintronics memristor can be handled in the same manner. In addition, similar Verilog-A models can be used for graphene based transistors and tunnel FET. The Verilog-A based model is simulated and for comparison Simulink/Simscape model is also simulated.

Figure 6:
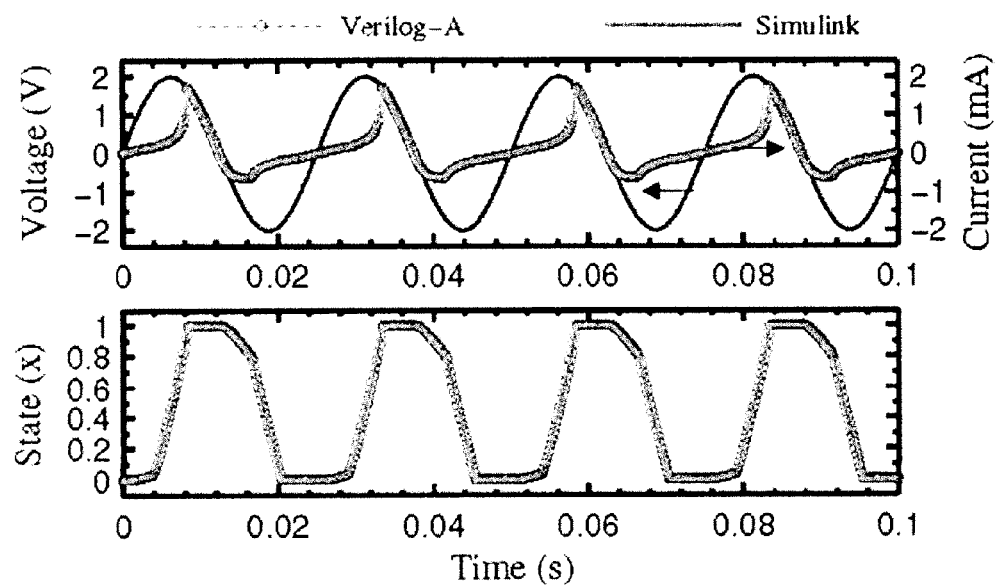
FIG. 6 is a diagram of a time domain simulation of voltages and states of the thin-film memristor for a specific parameter set.
Figure 7:
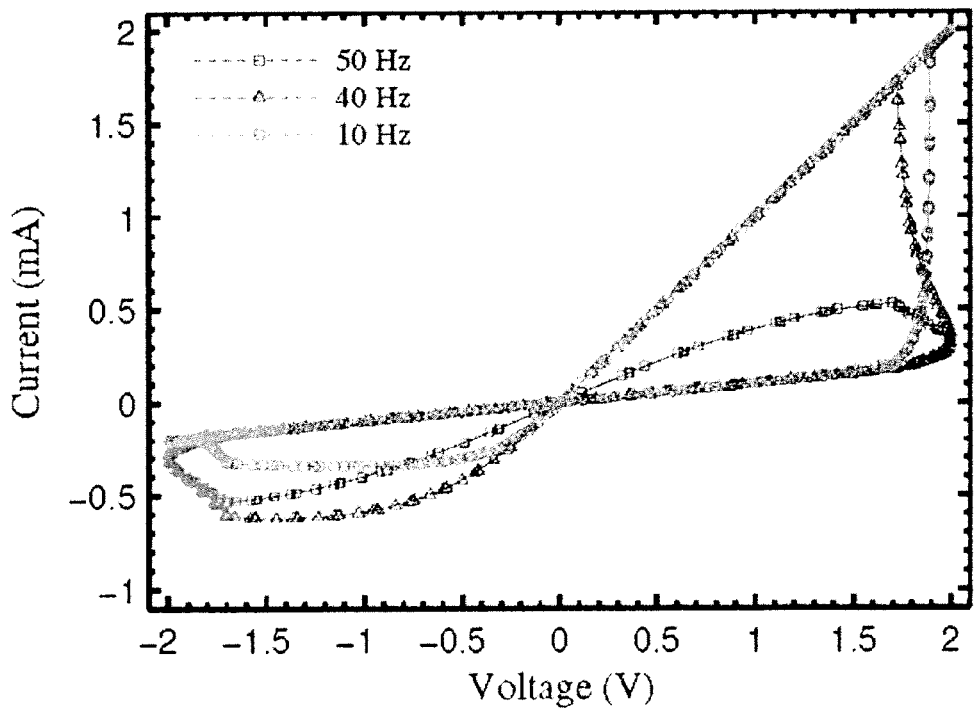
FIG. 7 shows results for sinusoidal input voltage and specific device parameter set of I-V curves of Verilog-A memristor simulations for various frequencies.

FIG. 6 is a diagram of a time domain simulation of voltages and states of the thin-film memristor for a specific parameter set. The current-voltage (I-V) characteristics of the thin-film memristor derived using the proposed Verilog-A model shown above. The Verilog-A model can deal with different kind of inputs and simulate the memristors. FIG. 7 shows results for sinusoidal input voltage and specific device parameter set of I-V curves of Verilog-A memristor simulations for various frequencies.

Figure 8:
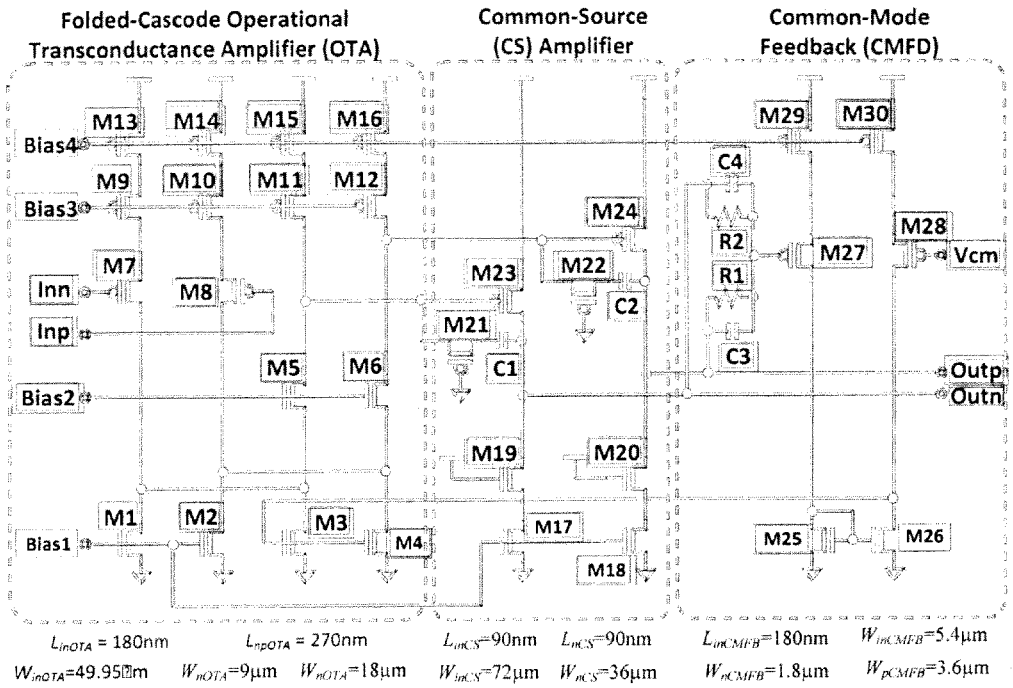
FIG. 8 is a circuit diagram of an exemplary fully differential operation amplifier (OP-AMP) sized for 90 nm CMOS process and 1V supply voltage.

The iVAMS framework can be used for design optimization of any suitable mixed-signal component or analog block. FIG. 8 is a circuit diagram of an exemplary fully differential operation amplifier (OP-AMP) sized 90 nm CMOS process and 1V supply voltage. The OP-AMP consists of a folded-cascode operational transconductance amplifier (OTA), a common-source amplifier, and a common-mode feedback (CMFB) circuit. The performance metrics of interest for this OP-AMP are the open-loop DC gain, bandwidth, phase margin, slew rate, and power dissipation. Metamodels for these metrics were generated for iVAMS block-level optimization. In order to construct a meta-macromodel for system-level design exploration, metamodels for the circuit parameters used in the macromodel are also required. These circuit parameters include the transconductance gm, and the positive and negative maximum available currents Ip and In of the OP-AMP input stage.

Figure 9:
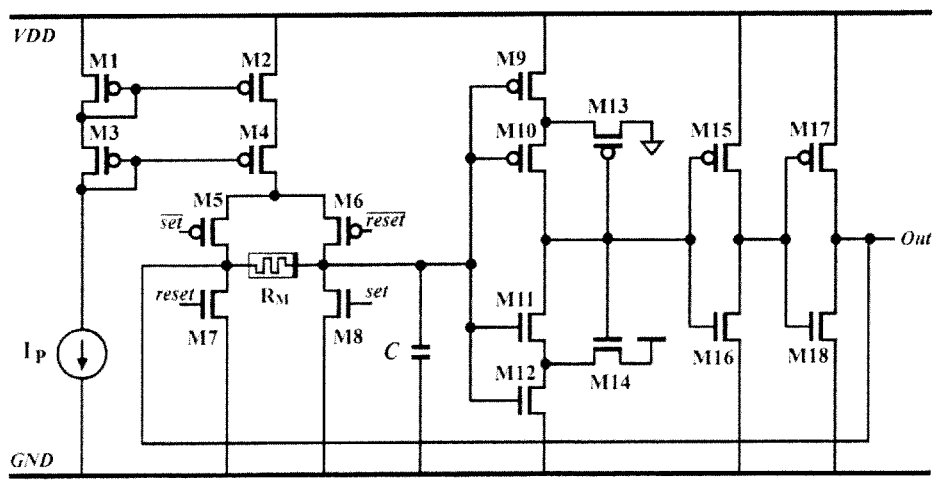
FIG. 9 is a diagram of a memristor based Schmitt trigger oscillator.

FIG. 9 is a diagram of a memristor based Schmitt trigger oscillator. The transistors can have any suitable size depending on the technology node. The use of a memristor and some additional circuitry in the place of a regular resistor make the circuit programmable. The programming process consists of two phases: Reset and Set. The reset switches are closed and the set switches are open. During the reset phase, constant current flows through the memristor for sufficiently long time to set a specific state of the memristor. Constant current flows through the memristor reversely during the set stage compared to the reset phase until the desired memristance is reached. Such a programmable oscillator can be used for ultra-low power capacitive and inductive sensing as well as pressure sensing.

Figure 10:
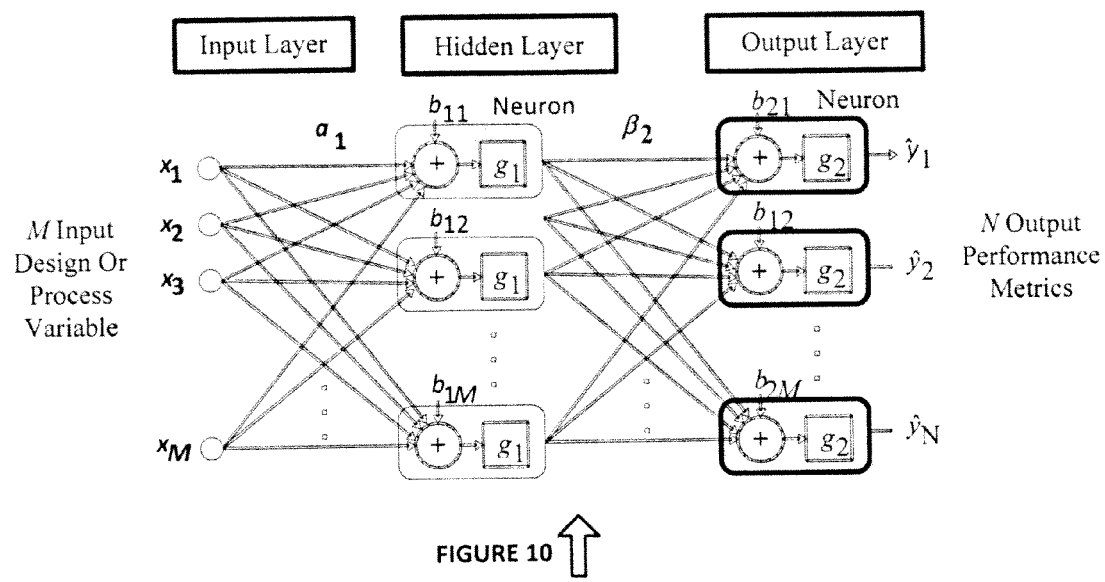
FIG. 10 is a diagram of an architecture of an artificial neural network (ANN) with a single hidden layer, chosen for the metamodels.

FIG. 10 is a diagram of an architecture of an artificial neural network (ANN) with a single hidden layer, chosen for the metamodels. With sufficient neurons in the hidden layer, this architecture can approximate any suitable sufficiently smooth function, even if it is non-linear. The input layer x can be a vector of the OP-AMP design variables which include the bias current and the transistor widths and lengths. In this exemplary embodiment, there are thirty transistors in the OP-AMP design. By properly grouping the transistors, sixteen design variables are provided. For example, the current mirror devices M1-M4 in FIG. 8 can all have the same size, therefore two variables, instead of eight, can be used. In this work, the hidden layer consists of four neurons (M=4) with hyperbolic tangent function as the activation function g1. The output layer is a single neuron employing a linear activation function g2. The model output y is one of the performance metrics or circuit parameters. $\alpha\_1$ is a matrix composed of the weights of the connections from the design variables in the input layer to the neurons in the hidden layer. Similarly, β_2 is formed by the weights of the connections from the hidden layer to the output layer. Additional control on each neuron is through bias bij (i=1; 2 and j=1; 2; . . . ; M). The neural networks were trained using as little as 100 samples with Bayesian Regulation training and other training methods. The ANN metamodels achieve higher accuracy overall. For all circuit responses (e.g., phase margin, Ip, and In) the ANN metamodels attain reasonable accuracy. Another advantage of the ANN metamodels over other types of metamodels (such as polynomial) is that their accuracy can be further improved by adding more neurons to the hidden layer, without drastically increasing the model complexity. All ANN metamodels in this design employ a 4-neuron hidden layer for the 90 nm CMOS based OP-AMP design.

Figure 11:
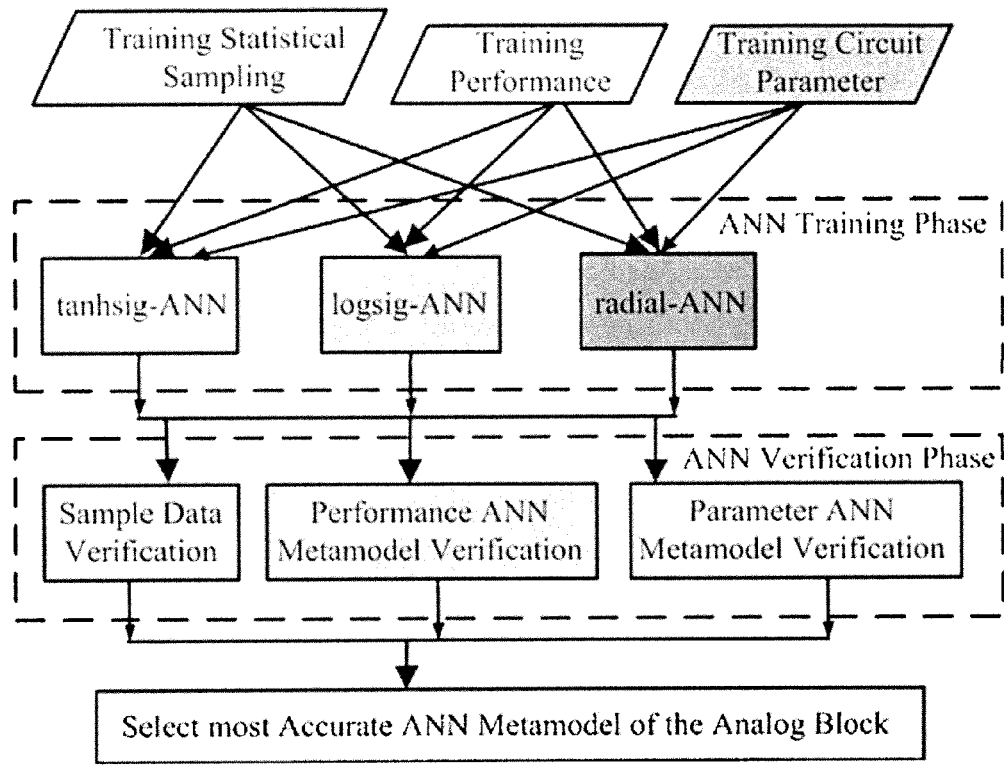
FIG. 11 is a diagram of an exemplary flow for ANN metamodeling to select the most appropriate ANN form and number of layers.

In practice, adaptively adjusting the hidden layer size is recommended to find the optimal model. The selection of a specific artificial neural network architecture is a decision that will depend on the specific mixed-signal block and circuit parameter. FIG. 11 is a diagram of an exemplary flow for ANN metamodeling to select the most appropriate ANN form and number of layers. In the ANN generation flow, a training data set is generated using statistical sampling such as Latin Hypercube Sampling (LHS) or mid-Latin hypercube sampling (MLHS). The sampled data are used for the training of the ANN. The verification is conducted using a verification data set that is a small percentage of the size of the training data set and is generated also using statistical sampling. It is important that the training and verification data sets are distinct, as otherwise, the performance of the ANN can be artificially inflated. Statistical fitting data is collected from both training and verification data. The best configuration metamodel is selected based on the statistical data. The two common nonlinear activation functions that are usually used for the hidden layer are the following:

$$y\_j(x\_j) = (1/((1+e^{(-\tau x\_j)})))$$

$$y\_j(x\_j) = \tan h(\tau x\_j)$$

Where j denotes a neuron in the hidden layer, xj and yj are its input and output, respectively, and the parameter τ defines the neuron transfer function steepness. A linear layer function has the following format:

$$y\_j(x\_j) = \Sigma\_(i=1)^s [(\alpha\_{ji} x\_i)] + \alpha\_j0$$

where α_ji is the weight connection between the j-th component in the hidden layer and the i-th component of the input. The ANN training can be performed such as to minimize an error estimate (e.g. least squares criterion). The neuron layer with minimum error is selected to be considered in the metamodel. Several ANN non-linear layer functions are tested, as shown in the "ANN training phase" in FIG. 11. After the training phase, the verification phase follows. In this phase 3 types of verifications are performed. Sample data verification deals with the verification of data obtained from the design sample space. Performance metamodel verification verifies the accuracy of ANN metamodels of the figures of merits (PMMs). After that, the ANN metamodels of the circuit parameters (CPMs) are verified for accuracy with actual circuit parameters.

Figure 12:
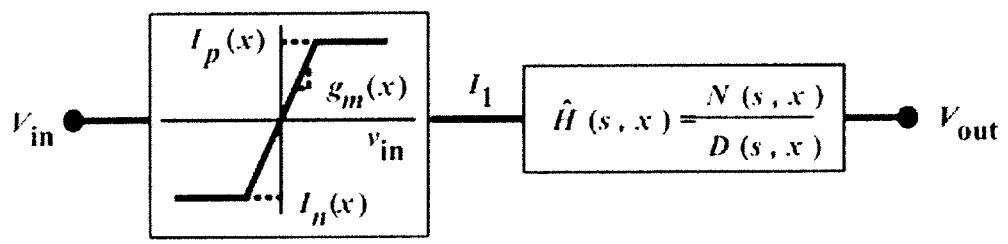
FIG. 12 is a meta-macromodel of the designed OP-AMP.

The meta-macromodel can facilitate fast and circuit/layout-accurate system-level design optimization of mixed-signal and analog blocks. Meta-macromodel construction starts with macromodel selection. The macromodels that can be used include the structural model, the linear time-invariant (LTI) model, and the symbolic model. We adopted a symbolic model since it not only models the small-signal behavior of analog blocks but also the large-signal behavior such as slew-rate limitation. This model is combined with the iVAMS circuit parameter metamodels to form the meta-macromodel. FIG. 12 is a meta-macromodel of the designed OP-AMP. Similar meta-macromodels can be made for other analog block such as voltage controlled oscillators, phase-locked loop (PLL) components, filters, analog-to-digital converters (ADCs), digital-to-analog converters (DACs), and sensors.

The two-stage meta-macromodel in FIG. 12 takes into account the slew rate effect due to the limited maximum available positive and negative currents Ip and In. There circuit parameters, together with the transconductance of the first stage gm and the OP-AMP small-signal function H(s), are functions of the design variables. They are estimated using the iVAMS CPMs. These CPMs all have the same artificial neural network architecture shown in FIG. 10. With g1 being a hyperbolic tangent function and g2 being a pure linear function, this architecture can be expressed mathematically as:

$$y_1 = b_{2l} + \sum_{j=1}^{M} \left( \beta_{2,jl} \cdot \tanh\left( \beta_{1j} + \sum_{i=1}^{N} \alpha_{1,ij} \cdot x_i \right) \right)$$

where α_(1,ij) ∈ α_1 and β_(2,j1) ∈ β_2. Implementing these ANN mathematical models in Verilog-AMS is an important step of building the iVAMS meta-macromodel.

An example of an iVAMS meta-macromodel is shown below:

```
function real ANN_metamodel;
... ...
integer α_1, β_2, b1, b2, i, j, readfile, ... ...;
real w, b, v, u;
// Read metamodel weights and bias from text files.
// α_1, β_2, b1, and b2.
... ...
v = 0.0;
for (j = 0; j < nl; j = j + 1)
begin
    u = 0.0;
    for (i = 0; i < size_x; i = i + 1)
    begin
        readfile = $fscanf(w1, "%e", w);
        u = u + w * x[i];
    end
    readfile = $fscanf(w2, "%e", w);
    readfile = $fscanf(b1, "%e", b);
    v = v + w * tanh(u + b);
end
readfile = $fscanf(b2, "%e", b);
ANN_metamodel = v + b;
... ...
End function
```

After training the neural networks for the CPMs, the artificial neural network weights and biases are stored in text files. In the initial block of the OP-AMP Verilog-AMS module, these weights and biases are read from the files, and the function ANN_metamodel computes the circuit parameter values for the meta-macromodel. The computed circuit parameter values are used in an analog process in the Verilog-AMS module to realize the model in FIG. 12. The OP-AMP small-signal function can be described using a function such as Laplace_ND.

Figure 13:
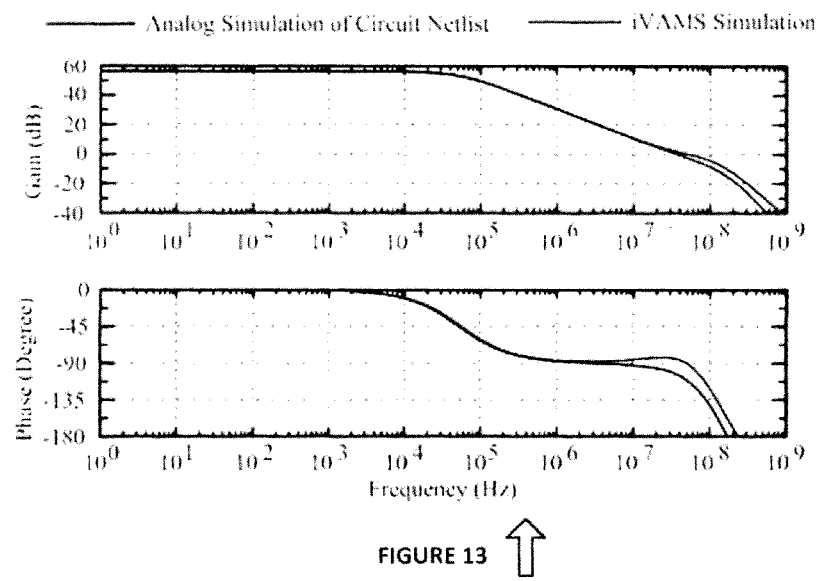
FIG. 13 is a diagram of OP-AMP AC analysis using iVAMS and the circuit netlist using an analog simulator.

The quality of the meta-macromodel relies on the accuracy of the CPMs and the suitability of the selected macromodel. FIG. 13 is a diagram of OP-AMP AC analysis using iVAMS and the circuit netlist using an analog simulator. The top subfigure shows the gain and the bottom subfigure shows the phase plot of the OP-AMP. As evident from the figure the iVAMS can perform the simulations of the OP-AMP as accurate as an analog simulator but much faster, as much as 1,000 times faster.

Figure 14:
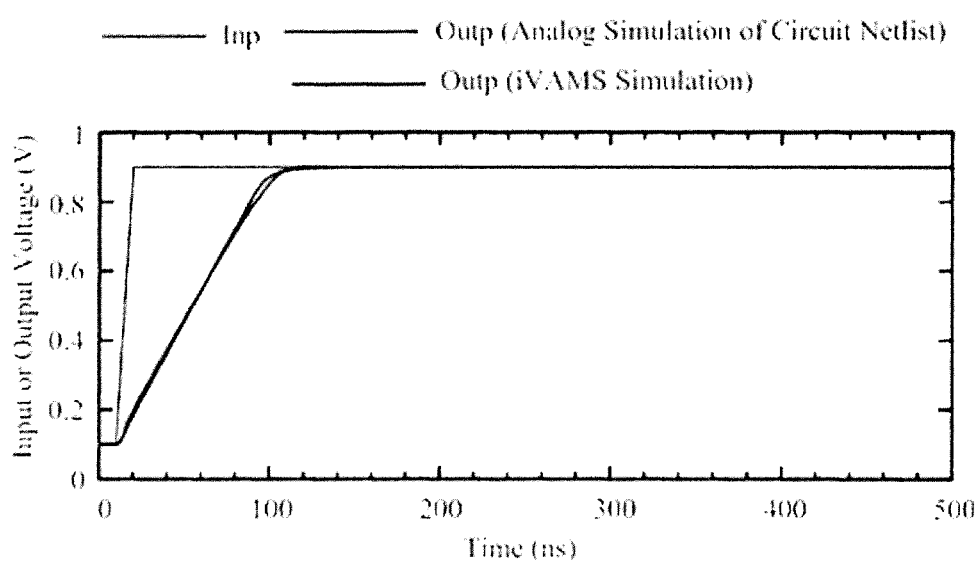
FIG. 14 is a diagram of an OP-AMP transient analysis using iVAMS and the circuit netlist using an analog simulator.

FIG. 14 is a diagram of an CP-AMP transient analysis using iVAMS and the circuit netlist using an analog simulator. As is evident from the figure, the iVAMS can perform the simulations of the OP-AMP as accurate as an analog simulator but much faster, as much as 1,000 times faster. Thus, iVAMS can bring circuit/layout accuracy to system level.

Memristor-based programmable oscillator iVAMS code is presented below:

```
'timescale 10ps / 1ps
'include " constants . vams"
'include " disciplines . vams"
module programmable_memristor_osc (out, reset, set);
parameter integer nb = 126; // Number of basis functions
parameter real vdd = 1.0 from    (0:10);
parameter real gnd =  0.0;
input set , reset ;
output out ;
logic out ,    set ,     reset ;
reg out ;
real dvar [0 :    4];     // Design variables
real   bf0 ,   ex,   co,   fosc ;
integer   readfile ,   fd , fd_ex , fd_co,   i , k;
initial   begin
     out = 0;
     fd = $fopen(" design_variable_values . csv","r");i =0;
     while (! $feof ( fd )) begin
          readfile = $fscanf ( fd , "%e", dvar[ i ]);
          i = i + 1;
     end
     $fclose ( fd );
     fd_ex = $fopen(" basis_function_exp . csv" , "r" );
     fd_co = $fopen(" basis_function_coeff . csv" , "r" );
     for (k = 0; k < nb; k = k + 1) begin
          bf0 = 1.0;
          for ( i = 0; i < 5; i = i + 1) begin
               readfile  = $fscanf (fd_ex , "%e", ex );
               bf0 = bf0 * pow(dvar[i ], ex );
          end
          readfile = $fscanf (fd_co, "%e", co );
          fosc = fosc + co * bf0 ;
     end
$fclose (fd_ex );
$fclose (fd_co );
End
always begin
     if    ( fosc < 0)    fosc = 1M;
     else    if    ( fosc  > 1G) fosc = 1G;
     #(0.5    /    fosc    / 10p) out = ~out;
     end
endmodule
```

Figure 15:
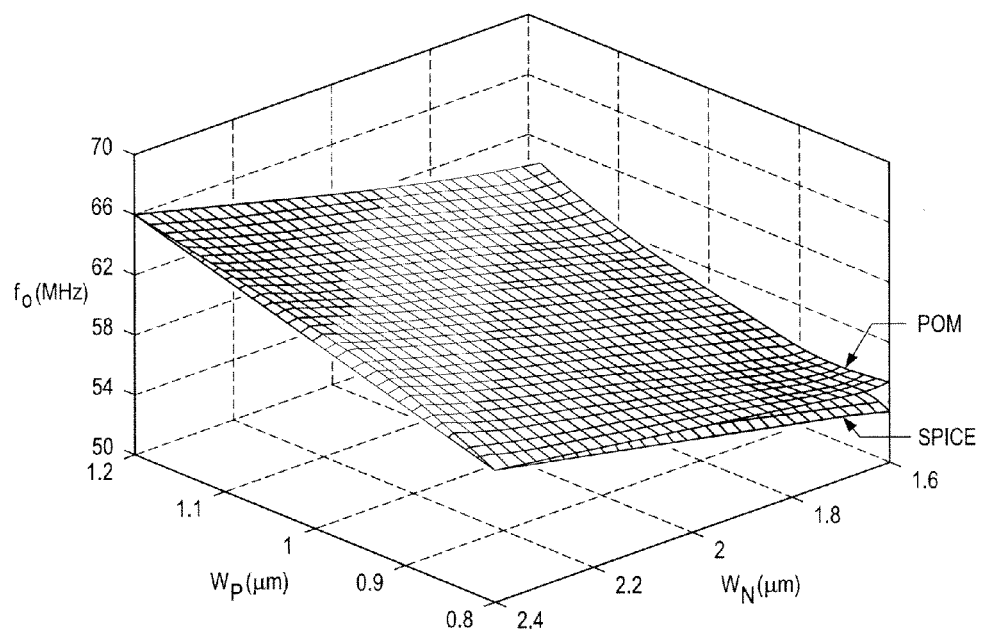
FIG. 15 is a diagram of an oscillation frequency response surface as a function of transistor sizes when the memristor has balanced doping (half oxide and half oxide with excess oxygen).

In this specific iVAMS code polynomial metamodels of the memristor-based programmable oscillator are integrated in Verilog-AMS. In a similar manner as the above, ANN based metamodels can be developed and integrated in Verilog-AMS for this oscillator as well. FIG. 15 is a diagram of an oscillation frequency response surface as a function of transistor sizes when the memristor has balanced doping (half oxide and half oxide with excess oxygen). A response surface as a function of the transistor sizes is plotted in FIG. 15 to analyze this memristor-based oscillator. The true surface from SPICE simulations is also shown. For a 20% variation of WP and WN, the output frequency can vary approximately from 54 MHz to 66 MHz.

Mixed-signal or analog block optimization using iVAMS is now presented with the OP-AMP design as an example. In this example, the OP-AMP is required to have high slew rate while consuming minimum power. Thus the optimization problem is to maximize slew rate and to minimize power dissipation, constrained by the requirements for gain, bandwidth, and phase-margin. For a single "best" solution for such a multi-objective problem is to find the Pareto front that consists of a set of non-dominated solutions for the optimization problem. The designer can then select one design from this solution set to implement. Metaheuristic algorithms have shown promising results in solving multi-objective analog circuit optimization problems. In this study, a multiobjective firefly algorithm belonging to the same category is used. It mimics the behavior of tropic firefly swarms which are attracted toward flies with higher flash intensity. The proposed iVAMS-assisted multiobjective firefly algorithm for OP-AMP design is provided below:

```
Current iteration  NT ← 0;
Initialize a vector of K designs X = {x_1; x_2; ... ; x_K};
while (NT < NT_max ) do
     Evaluate OP-AMP performance for all designs in X
using iVAMS;
     Find non-dominated designs out of all the possible
designs;
     for (i = 1 to K) do
          if No non-dominated designs are found then
               Generate random weight in range [0,1];
               Find design x that maximizes FoM(x)= (1−
               α)*Slew-Rate(x) + α*Power-Dissipation(x);
               Compute a move vector Δx_i ;
          else
               Compute a move vector Δx_i for x_i toward non-
               dominant designs;
          end if
          Constraint1 ← Gain(Δx_i+x_i)>Gain_min;
          Constraint2 ← Bandwidth((Δx_i+x_i)>Bandwidth_min;
          Constraint3 ← Phase-Margin(Δx_i+x_i)>Phase-Margin_min;
          if Not all constraints are satisfied then
               Generate a new move;
          end if
     end for
     Update the design with move vector of all designs;
Increment iteration NT;
end while
```

The goal of the firefly algorithm is to find K Pareto points that constitute the Pareto front through a predetermined number of iterations, NTmax. The algorithm starts with K randomly generated designs. During each iteration of the Multi-Objective Firefly Algorithm (MOFA), the performance of the K OP-AMP designs are estimated using the iVAMS PMMs. If non-dominated designs are found, move vectors from each current design toward the non-dominated designs will be computed based on the attractiveness of these designs and the characteristic distance. If no non-dominated designs are found, a move vector toward a current best design determined by the combined weighted sum of the objectives, FoM(x), is computed for each current design. Slew-Rate(x) and Power-Dissipation(x) are the slew rate and power dissipation for a design point x estimated using the iVMAS, and are normalized with respect to their own sample mean and standard variation. The current designs will be moved to new locations within the design space using the computed move vectors. The PMMs are then used to check whether the new designs satisfy the constraints. If not, new moves are generated. It can be seen that the iVAMS-based optimization is 5,000× faster than the netlist-based optimization.

A 2nd optimization algorithm, Cuckoo search, is presented which works very well in the framework of iVAMS. The metamodels in iVAMS are used to estimate the OP-AMP characteristics for each possible solution. The iVAMS-assisted Cuckoo Search is shown in FIG. 20. The objective of the optimization is to minimize the OP-AMP power dissipation with the gain, bandwidth, phase margin, and slew rate as the constraints. The metamodels of gain, bandwidth, phase margin, and slew rate are used to estimate the OP-AMP performance and thus to determine if the constraints are met. The power dissipation metamodel in iVAMS is used as the objective function to predicate the OP-AMP power dissipation for each possible solution. In this case, the iVAMS assisted optimization is 15,000× faster than the traditional method.

```
Initialize K designs X_k (k = 1, 2, ..., n);
Current iteration NT ← 0;
Evaluate power dissipation of each design using iVAMS;
Find minimum power dissipation among the current designs;
while (Power_obj < Power_min) and (NT < NT_max) do
    Get a new design x_i randomly by Levy flights;
    Evaluate Power dissipation of x_i;
    Randomly choose a design x_j from the X_k designs;
    if ( Power (x_i) < Power (x_j) ) then
        Constraint1 ← Gain(Δx_i+x_i)>Gain_min;
        Constraint2 ← Bandwidth((Δx_i+x_i)>Bandwidth_min;
        Constraint3 ← Phase-Margin(Δx_i+x_i)>Phase-Margin_min;
        Constraint4 ← Slew-Rate(x_i) > Slew-Rate_min;
        if All constraints met then
            Replace design x_i by design x_j;
        end if
    end if
    Evaluate power dissipation of all K designs;
    Rank x_k based on the power dissipation of K designs;
    Abandon a fraction of worst designs;
    Generate new designs randomly by Levy flights;
    Find minimum power dissipation among current designs;
    Increment the Current iteration;
end while
```

As used herein, "hardware" can include combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes a microcomputer or other suitable controller, memory devices, input-output devices, displays, data input devices such as keyboards or mouses, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections.

It should be emphasized that the above-described embodiments are merely examples of possible implementations. Many variations and modifications may made to the above-described embodiments without departing from the principles of the present disclosure. All such modifications and variations are intended to be included herein within the scope of this disclosure and protected by the following claims.

The invention claimed is:

1. A method for modeling a circuit comprising:
   storing a plurality of design variable ranges for a circuit component in a non-transient electronic data memory;
   performing transistor-level simulations at a plurality of sample points for the circuit component using a processor to generate a plurality of design variable samples for the circuit component and generating a plurality of circuit response samples;
   selecting and storing a neural network architecture in the non-transient electronic data memory that models the plurality of design variable samples for the circuit component; and
   generating a performance metric metamodel and a circuit parameter metamodel based on the neural network architecture using a processor operating Verilog-AMS;
   storing the performance metric metamodel and the circuit parameter metamodel;
   training the neural network architecture with a processor using the design variable samples and the circuit response samples; and
   generating one or more analog block metamodels using the trained neural network architecture.

2. The method of claim 1 further comprising adjusting sample points for the transistor-level simulations using the processor if a predetermined accuracy is not met.

3. The method of claim 1 further comprising adjusting the architecture of the neural network using the processor if a predetermined accuracy is not met.

4. A method for modeling a circuit comprising:
   (a) determining a range for each of a plurality of design variables using a processor;
   (b) determining a sample number for a circuit component using the processor;
   (c) performing an analog block design space sample with transistor level simulations of the circuit component to generate design variable samples and circuit response samples for the circuit component;
   (d) performing neural network training on the processor to generate a neural network architecture;
   (e) storing an analog block metamodel that comprises the neural network architecture in a non-transient data memory;
   (f) determining whether a predetermined accuracy metric has been met or exceeded an estimate constraint based on the neural network architecture with the processor;
   (g) repeating steps (a) through (f) if the accuracy metric has not been met or exceeded the estimate constraint; and
   (h) generating a performance metric metamodel and a circuit parameter metamodel based on the neural network architecture with the processor if the accuracy metric has been met or exceeded the estimate constraint.

5. The method of claim 4 wherein performing the neural network training on the processor to generate the neural network architecture comprises performing sample data verification.

6. The method of claim 4 wherein performing the neural network training on the processor to generate the neural network architecture comprises performing performance metamodel verification.

7. The method of claim 4 wherein performing the neural network training on the processor to generate the neural network architecture comprises performing parameter metamodel verification.

8. The method of claim 4 wherein performing the neural network training on the processor to generate the neural network architecture comprises performing statistical sample training.

9. The method of claim 4 wherein performing the neural network training on the processor to generate the neural network architecture comprises performing performance training.

10. The method of claim 4 wherein performing the neural network training on the processor to generate the neural network architecture comprises performing circuit parameter training.

11. The method of claim 4 further comprising integrating the performance metric metamodel and the circuit parameter metamodel using Verilog-AMS operating on the processor.

12. The method of claim 4 further comprising integrating the performance metric metamodel and the circuit parameter metamodel with a macromodel using Verilog-AMS operating on the processor.

13. The method of claim 4 wherein repeating steps (a) through (f) if the accuracy metric has not been met or exceeded comprises modifying the sample number for the circuit component.

14. The method of claim 4 wherein repeating steps (a) through (f) if the accuracy metric has not been met or exceeded comprises modifying the neural network architecture.

15. A method for modeling a circuit comprising:
(a) determining a range for each of a plurality of design variables using a processor;
(b) determining a sample number for a circuit component using the processor;
(c) performing an analog block design space sample with transistor level simulations of the circuit component to generate design variable samples and circuit response samples for the circuit component;
(d) performing neural network training on the processor to generate a neural network architecture with sample data verification, performance metamodel verification, parameter metamodel verification, statistical sample training, performance training and circuit parameter training;
(e) storing an analog block metamodel that comprises the neural network architecture in a non-transient data memory;
(f) determining whether a predetermined accuracy metric has been met or exceeded an estimate constraint based on the neural network architecture with the processor;
(g) repeating steps (a) through (f) if the accuracy metric has not been met or exceeded the estimate constraint by modifying the sample number for the circuit component and modifying the neural network architecture;
(h) generating a performance metric metamodel and a circuit parameter metamodel based on the neural network architecture with the processor if the accuracy metric has been met or exceeded the estimate constraint;
(i) integrating the performance metric metamodel and the circuit parameter metamodel with a macromodel using Verilog-AMS operating on the processor.

* * * * *